United States Patent
Tian et al.

(10) Patent No.: US 10,096,801 B2
(45) Date of Patent: Oct. 9, 2018

(54) DISPLAY DEVICE AND METHOD OF MANUFACTURING THEREOF

(71) Applicant: BOE TECHNOLOGY GROUP CO., LTD., Beijing (CN)

(72) Inventors: Yunyun Tian, Beijing (CN); Hyun Sic Choi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/107,662

(22) PCT Filed: Dec. 10, 2015

(86) PCT No.: PCT/CN2015/096934
§ 371 (c)(1),
(2) Date: Jun. 23, 2016

(87) PCT Pub. No.: WO2017/000502
PCT Pub. Date: Jan. 5, 2017

(65) Prior Publication Data
US 2017/0179439 A1    Jun. 22, 2017

(30) Foreign Application Priority Data

Jun. 29, 2015 (CN) .......................... 2015 1 0370267

(51) Int. Cl.
*H01L 29/08*    (2006.01)
*H01L 51/52*    (2006.01)
(Continued)

(52) U.S. Cl.
CPC ........ *H01L 51/5284* (2013.01); *G02B 5/3016* (2013.01); *H01L 27/3262* (2013.01);
(Continued)

(58) Field of Classification Search
CPC .................................................. H01L 51/5284
(Continued)

(56) References Cited

U.S. PATENT DOCUMENTS 5,986,731 A * 11/1999 Iijima .................... G02B 5/305
349/117
2003/0067574 A1* 4/2003 Sasaki .................. G02B 5/3083
349/117
(Continued)

FOREIGN PATENT DOCUMENTS

CN    1334483 A    2/2002
CN    1402538 A    3/2003
(Continued)

OTHER PUBLICATIONS

The First Office Action in the Chinese Patent Application No. 201510370267.4, dated May 18, 2017; English translation attached.
(Continued)

*Primary Examiner* — Ajay K Arora
(74) *Attorney, Agent, or Firm* — Intellectual Valley Law, P.C.

(57) ABSTRACT

The present application discloses a display device having a metal pattern on a substrate of a display device and a light absorbing layer positioned to absorb light reflected by the metal pattern, and a manufacturing method thereof. The light absorbing layer has a pattern corresponding to at least a portion of the metal pattern.

20 Claims, 5 Drawing Sheets

(51) Int. Cl.
  *G02B 5/30* (2006.01)
  *H01L 27/32* (2006.01)
  *G02F 1/1335* (2006.01)
  *G02F 1/13363* (2006.01)
  *G02F 1/1362* (2006.01)
  *G02F 1/1333* (2006.01)

(52) U.S. Cl.
  CPC ...... *H01L 27/3272* (2013.01); *H01L 27/3276* (2013.01); *G02F 1/13338* (2013.01); *G02F 1/13363* (2013.01); *G02F 1/133528* (2013.01); *G02F 1/136286* (2013.01); *G02F 2001/133638* (2013.01); *G02F 2001/136295* (2013.01); *G02F 2413/02* (2013.01); *H01L 2227/323* (2013.01)

(58) Field of Classification Search
  USPC .......................................................... 257/40
  See application file for complete search history.

(56) References Cited

U.S. PATENT DOCUMENTS

| | | |
|---|---|---|
| 2005/0035353 A1 | 2/2005 | Adachi et al. |
| 2006/0164571 A1 | 7/2006 | Broer et al. |
| 2010/0252825 A1* | 10/2010 | Yamazaki ........... H01L 51/5281 257/40 |
| 2013/0303677 A1* | 11/2013 | Kim ..................... G02B 5/3016 524/508 |
| 2015/0177435 A1 | 6/2015 | Kim et al. |
| 2015/0380475 A1 | 12/2015 | Shu et al. |

FOREIGN PATENT DOCUMENTS

| | | |
|---|---|---|
| CN | 1591101 A | 3/2005 |
| CN | 1688905 A | 10/2005 |
| CN | 102881711 A | 1/2013 |
| CN | 103500753 A | 1/2014 |
| CN | 103531610 A | 1/2014 |
| CN | 104160307 A | 11/2014 |
| CN | 104914615 A | 9/2015 |
| JP | 2001091971 A | 4/2001 |
| KR | 20140126984 A | 11/2014 |
| KR | 20150037650 A | 4/2015 |

OTHER PUBLICATIONS

International Search Report & Written Opinion dated Apr. 5, 2016 regarding PCT/CN2015/096934.
The Second Office Action in the Chinese Patent Application No. 201510370267.4, dated Dec. 22, 2017; English translation attached.

* cited by examiner

DISPLAY DEVICE AND METHOD OF MANUFACTURING THEREOF

CROSS-REFERENCE TO RELATED APPLICATION

This application is a national stage application under 35 U.S.C. § 371 of International Application No. PCT/CN2015/096934 filed Dec. 10, 2015, which claims priority to Chinese Patent Application No. 201510370267.4, filed Jun. 29, 2015, the contents of which are incorporated by reference in the entirety.

FIELD

The present invention relates to display technology, more particularly, to a display device and a method of manufacturing thereof.

BACKGROUND

Display devices such as liquid crystal display (LCD) and organic light-emitting display (OLED) have been widely used. LCD and OLED display devices include metal structures such as gate lines and data lines. These metal structures reflect incident light, reducing display quality.

SUMMARY

In one aspect, the present invention provides a display device, comprising a metal pattern on a first substrate of a display device; a first light absorbing layer positioned to absorb light reflected by the metal pattern.

Optionally, the first light absorbing layer has a pattern corresponding to at least a portion of the metal pattern.

Optionally, the display device further comprises a first quarter wave plate and a first half wave plate.

Optionally, the first quarter wave plate and the first half wave plate are so positioned that light reflected by the metal pattern passes through the first quarter wave plate and the first half wave plate in a sequential order before it is absorbed by the first light absorbing layer, wherein the first substrate is a substrate proximal to a first light emitting surface of the display device for image display.

Optionally, the metal pattern, the first quarter wave plate, the first half wave plate, and the first light absorbing layer are sequentially arranged on the first substrate along a direction away from the first substrate.

Optionally, the first light absorbing layer, the first half wave plate, the first quarter wave plate, and the metal pattern are sequentially arranged on the first substrate along a direction away from the first substrate.

Optionally, the first light absorbing layer comprises a mixture comprising polymer liquid crystal molecules and dichroic dye molecules, the total weight percentage of the polymer liquid crystal molecules in the mixture is in the range of 60% to 98%, the total weight percentage of the dichroic dye molecules in the mixture is in the range of 2% to 40%, or the weight ratio of the polymer liquid crystal molecules to the dichroic dye molecules in the mixture is in the range of 3:2 to 49:1.

Optionally, thickness of the first light absorbing layer is d, wherein $d = k\lambda/\sigma$, k is an integer, $\lambda$ is wavelength of an incident light reflected by the metal pattern, and $\sigma$ is refractive index of the first light absorbing layer.

Optionally, the display device further comprises a second substrate facing the first substrate; a second light absorbing layer positioned to absorb light reflected by the metal pattern; a second quarter wave plate; and a second half wave plate.

Optionally, the second light absorbing layer has a pattern corresponding to at least a portion of the metal pattern; wherein the second quarter wave plate and the second half wave plate are so positioned that light reflected by the second metal pattern passes through the second quarter wave plate and the second half wave plate in a sequential order before it is absorbed by the second light absorbing layer, wherein the second substrate is a substrate proximal to a second light emitting surface of the display device for image display.

Optionally, the first light absorbing layer, the first half wave plate, the first quarter wave plate, the metal pattern, the second quarter wave plate, the second half wave plate, the second light absorbing layer, and the second substrate are sequentially arranged on the first substrate along a direction away from the first substrate.

Optionally, the first light absorbing layer is a polarizer.

Optionally, the display device is an organic electroluminescence display device comprising an organic light emitting diode, the organic light emitting diode is connected to a switching transistor and comprises a transparent electrode.

Optionally, the metal pattern comprising one or more of the following: a gate line metal pattern, a data line metal pattern, a source/drain electrode metal pattern, and a touch electrode metal pattern.

In another aspect, the present invention provides a method of manufacturing a display device, comprising forming a metal pattern on a first substrate; and forming a light absorbing layer on the first substrate.

Optionally, the light absorbing layer has a pattern corresponding to at least a portion of the metal pattern.

Optionally, the step of forming the light absorbing layer on the first substrate is performed prior to the step of forming a metal pattern on the first substrate so that the metal pattern is formed on top of the light absorbing layer.

Optionally, subsequent to the step of forming the light absorbing layer, and prior to the step of forming the metal pattern, the method further comprises sequentially forming a half wave plate layer and a quarter wave plate layer on top of the light absorbing layer.

Optionally, the half wave plate layer and the quarter wave plate layer are so positioned that light reflected by the metal pattern passes through the quarter wave plate layer and the half wave plate layer in a sequential order before it is absorbed by the light absorbing layer.

Optionally, the step of forming the light absorbing layer on the first substrate is performed subsequent to the step of forming a metal pattern on the first substrate so that the light absorbing layer is formed on top of the metal pattern.

Optionally, subsequent to the step of forming the metal pattern and prior to the step of forming the light absorbing layer on the first substrate, the method further comprises sequentially forming a quarter wave plate layer and a half wave plate layer on top of the metal pattern.

Optionally, the quarter wave plate layer and the half wave plate layer are so positioned that light reflected by the metal pattern passes through the quarter wave plate layer and the half wave plate layer in a sequential order before it is absorbed by the light absorbing layer.

Optionally, the light absorbing layer comprises a mixture comprising polymer liquid crystal molecules and dichroic dye molecules, the total weight percentage of the polymer liquid crystal molecules in the mixture is in the range of 60% to 98%, the total weight percentage of the dichroic dye molecules in the mixture is in the range of 2% to 40%, or the weight ratio of the polymer liquid crystal molecules to the dichroic dye molecules in the mixture is in the range of 3:2 to 49:1.

Optionally, thickness of the light absorbing layer is d, wherein d=kλ/σ, k is an integer, λ is the wavelength of the light reflected by the metal pattern and transmitted into the light absorbing layer, and σ is the refractive index of the light absorbing layer.

Optionally, the light absorbing layer is a polarizer.

Optionally, wherein the display device is an organic electroluminescence display device, the method further comprising forming an organic light emitting diode on the first substrate comprising the metal pattern. The organic light emitting diode is connected to a switching transistor, and comprises a transparent electrode.

In another aspect, the present invention provides a method of manufacturing a display device, comprising forming a first light absorbing layer on top of a first substrate; sequentially forming a first half wave plate layer and a first quarter wave plate layer on top of the first light absorbing layer; forming a metal pattern on the first quarter wave plate layer; sequentially forming a second quarter wave plate layer and a second half wave plate layer on the metal pattern; and forming a second light absorbing layer on the second half wave plate layer.

BRIEF DESCRIPTION OF THE FIGURES

The following drawings are merely examples for illustrative purposes according to various disclosed embodiments and are not intended to limit the scope of the present invention.

DETAILED DESCRIPTION OF THE EMBODIMENTS

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Figure 1:
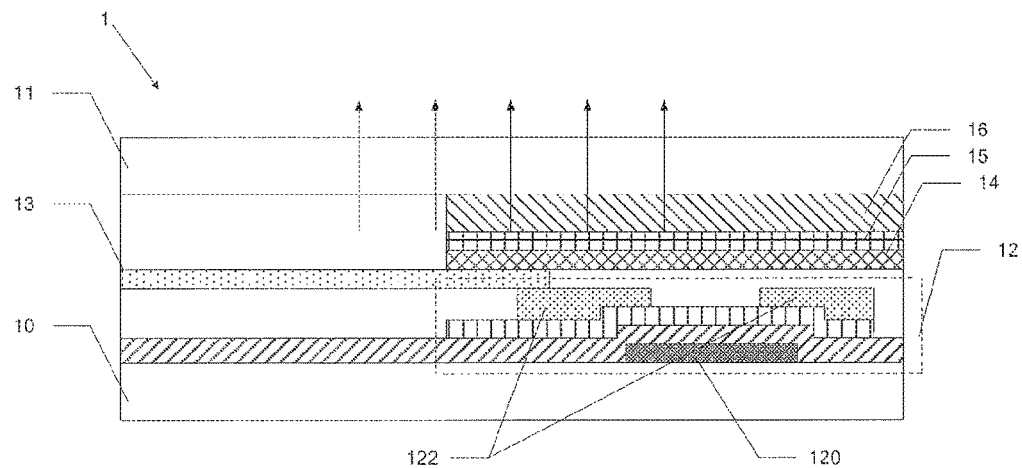
FIG. 1 is a diagram illustrating the structure of a display device in an embodiment.

FIG. 1 is a diagram illustrating the structure of a display device 1 in an embodiment. Referring to FIG. 1, the display device 1 in the embodiment includes a metal pattern 12 on a first substrate 10 of the display device 1 and a light absorbing layer 16 positioned to absorb light reflected from the metal pattern 12. The light absorbing layer 16 has a pattern corresponding to at least a portion of the metal pattern 12 so that light reflected by at least a portion of the metal pattern 12 is absorbed by the light absorbing layer 16. For example, the light absorbing layer 16 can have a same pattern as the metal pattern 12 so that two patterns overlap with each other in plan of the first substrate. Optionally, the light absorbing layer 16 pattern is larger in area as compared to the metal pattern 12, to ensure that as much as possible light reflected by the metal pattern 12 will be absorbed. Optionally, the light absorbing layer 16 pattern is slightly smaller in area than the metal pattern 12. Optionally, the light absorbing layer 16 is a transparent layer or a semi-transparent layer.

Referring to FIG. 1, the display device 1 in the embodiment also includes a half wave plate 15 and a quarter wave plate 14. The metal pattern 12, the quarter wave plate 14, the half wave plate 15, and the light absorbing layer 16 are sequentially arranged on the first substrate 1 along a direction away from the first substrate 1. In other words, the quarter wave plate 14, the half wave plate 15, and the light absorbing layer 16 are so positioned that light reflected by the metal pattern 12 first passes through the quarter wave plate 15 and the half wave plate 14 in a sequential order before it is absorbed by the light absorbing layer 16.

The light absorbing layer 16 may be made of any suitable light filtering material so long as it absorbs light reflected from the metal pattern 12. For example, the light absorbing layer 16 can be a layer comprising a light absorbing material such as graphite or other black materials. In some embodiments, the light absorbing layer 16 is a polarizer. Optionally, the polarizer is a liquid crystal polarizer. Various suitable liquid crystal materials may be used for making the light absorbing layer 16. For instance, the liquid crystal polarizer 16 can include a mixture of liquid crystal polymer molecules and dichroic dye molecules. The mixture can be cured by, e.g., heat or UV light. Examples of dichroic dyes may be found in U.S. Pat. No. 6,049,428 and also include anthraquinone series, azo series, azomethine series, benzidine series, indigo series, inerocyanine series, perylene series, quinone series, quinophthalone series, stilbene series, styryl series and tetrazine series. In addition to the liquid crystal polymer molecules and the dichroic dye molecules, the mixture may contain additives, such as adhesion and/or toughness enhancers, rheology modifiers, plasticizers, surfactants, leveling agents, etc., depending, for example, on the desired optical properties of the display.

Depending on the types of liquid crystal polymer molecules and dichroic dyes, various liquid crystal polymer to dichroic dye ratios may be used. Optionally, the weight ratio of the polymer liquid crystal molecules to the dichroic dye molecules in the mixture is in the range of 3:2 to 49:1, e.g., 3:2 to 13:7, 13:7 to 2:3, 2:3 to 3:1, 3:1 to 4:1, 4:1 to 17:3, 17:3 to 9:1, 9:1 to 19:1, 19:1 to 49:2. Optionally, the total weight percentage of the polymer liquid crystal molecules in the mixture is in the range of 60% to 98%, e.g., 60%-65%, 65%-70%, 70%-75%, 75%-80%, 80%-85%, 85%-90%, 90%-95%, 95%-98%. Optionally, the total weight percentage of the dichroic dye molecules in the mixture is in the range of 2% to 40%, e.g., 2%-5%, 5%-10%, 10%-15%, 15%-20%, 20%-25%, 25%-30%, 30%-35%, 35%-40%.

In some embodiments, the thickness of the light absorbing layer 16 may be determined by the expression $d=k\lambda/\sigma$, k is an integer, λ is the wavelength of the incident light, and σ is the refractive index of the light absorbing layer. Specifically, the thickness of the light absorbing layer 16 may be so designed that the phase difference between the incident light and the light reflected by the light absorbing layer 16 after only single reflection is multiple of the wavelength of the light.

In some embodiments, the light absorbing layer 16 is a linear polarizer 16, and the display device includes a half wave plate 15 sandwiched between the linear polarizer 16 and a quarter wave plate 14. An incident light passes through the linear polarizer 16 and is linearly polarized. In some embodiments, the half wave plate 15 has its optics axis set at an angle α with respect to the transmission axis of the linear polarizer 16. When the linearly polarized light from the linear polarizer 16 passes through the half wave plate 15, the plane of polarization of the light will be rotated by 2α. The quarter wave plate 14 has its optics axis set at an angle of 2α plus 45 degrees, with respect to the transmission axis of the linear polarizer 16. Thus, when the linearly polarized light from the half wave plate 15 enters into the quarter wave plate 14, it is converted into circularly polarized light, e.g., left circularly polarized light. The left circularly polarized light is then reflected from the metal pattern 12, and is converted into right circularly polarized light. The reflected, right circularly polarized light enters into the quarter wave plate 14. The right circularly polarized light is circularly polarized a second time by the quarter wave plate 14, and is now converted into linearly polarized light having a polarization direction perpendicular to the transmission axis of the linear polarizer 16. Accordingly, no reflected light passes through the linear polarizer 16.

Optionally, the half wave plate 15 has its optics axis set at 15 degrees with respect to the transmission axis of the polarizer 16, and the quarter wave plate 14 has its optics axis set at 75 degrees with respect to the transmission axis of the polarizer 16. When light passes through the polarizer 16, it becomes vertically polarized. The vertically polarized light is converted into left circularly polarized light after it passes through the half wave plate 15 and the quarter wave plate 14. The left circularly polarized light becomes right circularly polarized light after it is reflected by the metal pattern 12. Subsequently, the right circularly polarized light passes through the quarter wave plate 14 and the half wave plate 15, and is now converted into horizontally polarized light, the direction of which is vertical to the transmission axis of the polarizer 16. Thus, the horizontally polarized light cannot pass through the polarizer 16.

The display device may be a liquid crystal display (LCD) device or an organic light-emitting display (OLED) device. An OLED device may include an organic light emitting diode. Optionally, the electrodes of the organic light emitting diode is made of a transparent electrode material such as indium tin oxide (ITO). The display device may be a single-side emission device (see, e.g., FIGS. 1, 2, 4, and 5) or a dual-side emission device (see, e.g., FIGS. 3 and 6). In some embodiments, the display device includes a first substrate 10 and a second substrate 11 facing each other. Optionally, the light absorbing layer 16 is disposed on a side of the first substrate 10 facing the second substrate 11 or on a side of the second substrate 11 facing the first substrate 10.

Referring to FIG. 1, the display device in the embodiment includes a first substrate 10 and a second substrate 11 facing each other. Display device emits light from the second substrate 11 for image display. The display device in the embodiment also includes a metal pattern 12 on top of the first substrate 10, and a transparent electrode 13 connected to a drain electrode of a switching thin film transistor. The transparent electrode 13 can be, for example, a pixel electrode in a liquid crystal display device or an anode in an organic electroluminescence display device. The display device in the embodiment further includes a quarter wave plate 14 on top of the metal pattern 12 and the transparent electrode 13, a half wave plate 15 on top of the quarter wave plate 14, and a light absorbing layer 16 (e.g., a polarizer) on top of the half wave plate 15. The light absorbing layer 16 is disposed on the light emitting side of the display device, and has a pattern corresponding to at least a portion of the metal pattern 12. The switching thin film transistor may include a gate electrode, a source electrode, a drain electrode, and an active layer. The metal pattern 12 in the embodiment includes a gate line metal pattern 120, a data line metal pattern, and/or a source/drain electrode metal pattern 122 in a switching thin film transistor. Optionally, the metal pattern 12 can also include other metal patterns such as a touch electrode metal pattern. Optionally, one or more of gate line, data line, source/drain electrode, touch electrode may be made of a transparent material.

Figure 2:
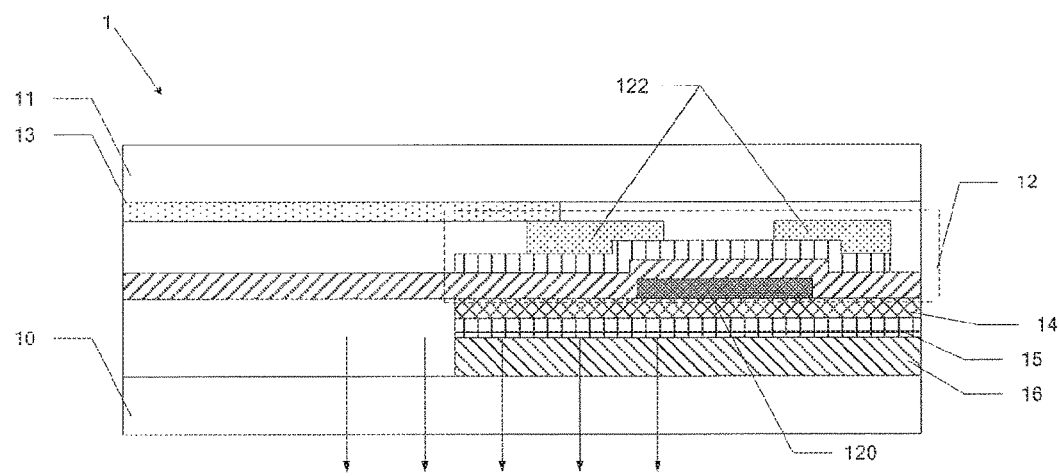
FIG. 2 is a diagram illustrating the structure of a display device in another embodiment.

FIG. 2 is a diagram illustrating the structure of a display device in another embodiment. Referring to FIG. 2, the display device in the embodiment includes a first substrate 10 and a second substrate 11 facing each other. Display device emits light from the first substrate 10 for image display. The display device in the embodiment also includes a light absorbing layer 16 on top of the first substrate 10 (e.g., on the inner surface of the first substrate 10), a half wave plate 15 on top of the light absorbing layer 16, a quarter wave plate 14 on top of the half wave plate 15. The display device also includes, on top of the quarter wave plate 14, a metal pattern 12 and a transparent electrode 13 connected to a drain electrode of a switching thin film transistor. The transparent electrode 13 can be, for example, a pixel electrode in a liquid crystal display device or an anode in an organic electroluminescence display device. The metal pattern 12 in the embodiment includes a gate line metal pattern 120, a data line metal pattern, and/or a source/drain electrode metal pattern 12 in a switching thin film transistor. Optionally, the metal pattern 12 can also include other metal patterns such as a touch electrode metal pattern. Optionally, one or more of gate line, data line, source/drain electrode, touch electrode may be made of a transparent material. The light absorbing layer 16 is disposed on the light emitting side of the display device, and has a pattern corresponding to at least a portion of the metal pattern 12.

Figure 3:
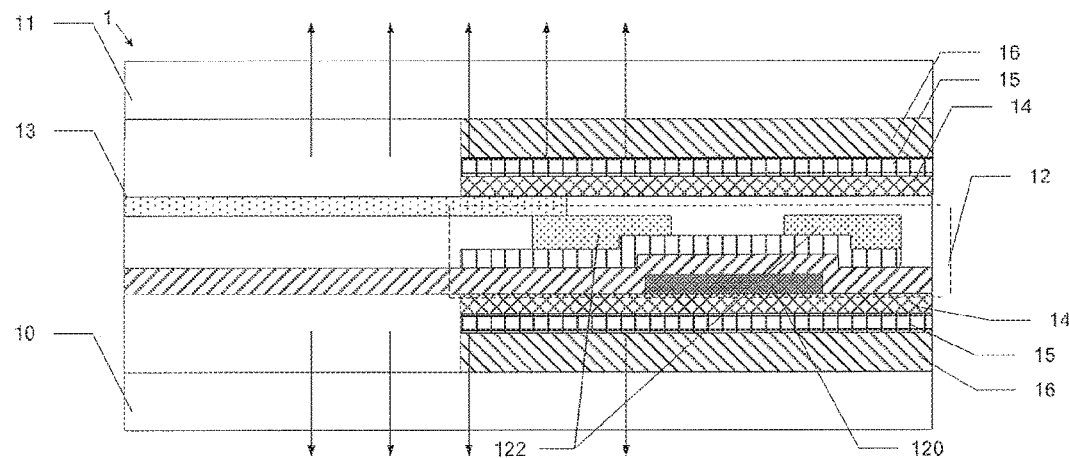
FIG. 3 is a diagram illustrating the structure of a display device in another embodiment.

FIG. 3 is a diagram illustrating the structure of a display device in another embodiment. Referring to FIG. 3, the display device in the embodiment includes a first substrate 10 and a second substrate 11 facing each other. The display device in the embodiment is a dual-side emission device for image display. The display device in the embodiment also includes a first light absorbing layer 16 on top of the first substrate 10 (e.g., on the inner surface of the first substrate 10), a first half wave plate 15 on top of the first light absorbing layer 16, a first quarter wave plate 14 on top of the first half wave plate 15, a metal pattern 12 and a transparent electrode 13 connected to a drain electrode of the switching thin film transistor on top of the first quarter wave plate 14, a second quarter wave plate 14 on top of the metal pattern 12 and the transparent electrode 13, a second half wave plate 15 on top of the second quarter wave plate 14, a second light absorbing layer 16 on top of the second half wave plate 15, and a second substrate 11 on top of the second light absorbing layer 16. The first and second light absorbing layers 16 are disposed on the two light emitting sides of the display device, and have a pattern corresponding to at least a portion of the metal pattern 12. The metal pattern 12 in the embodiment includes a gate line metal pattern 120, a data line metal pattern, and a source/drain electrode metal pattern 122 in a switching thin film transistor. Optionally, the metal pattern 12 can also include other metal patterns such as a touch electrode metal pattern. Optionally, one or more of gate line, data line, source/drain electrode, touch electrode may be made of a transparent material.

Figure 4:
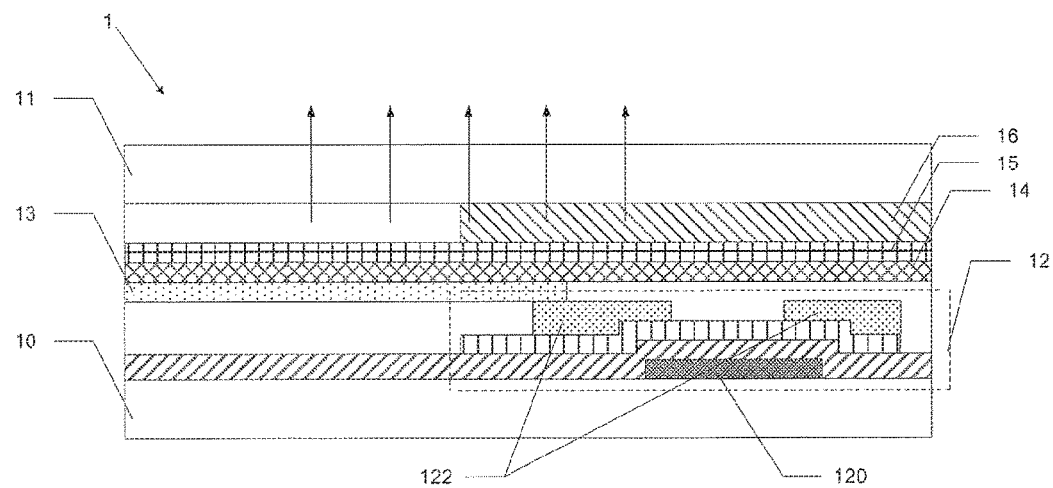
FIG. 4 is a diagram illustrating the structure of a display device in another embodiment.
Figure 5:
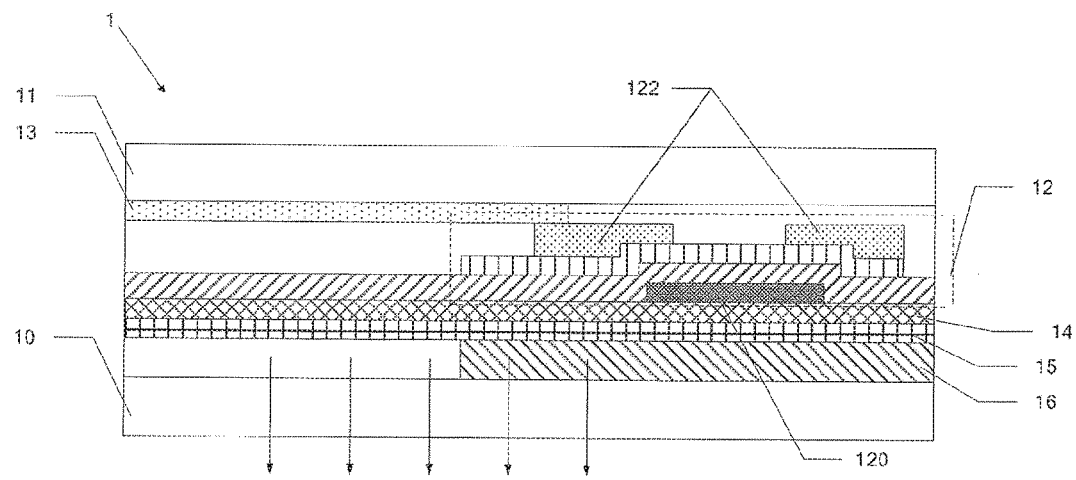
FIG. 5 is a diagram illustrating the structure of a display device in another embodiment.
Figure 6:
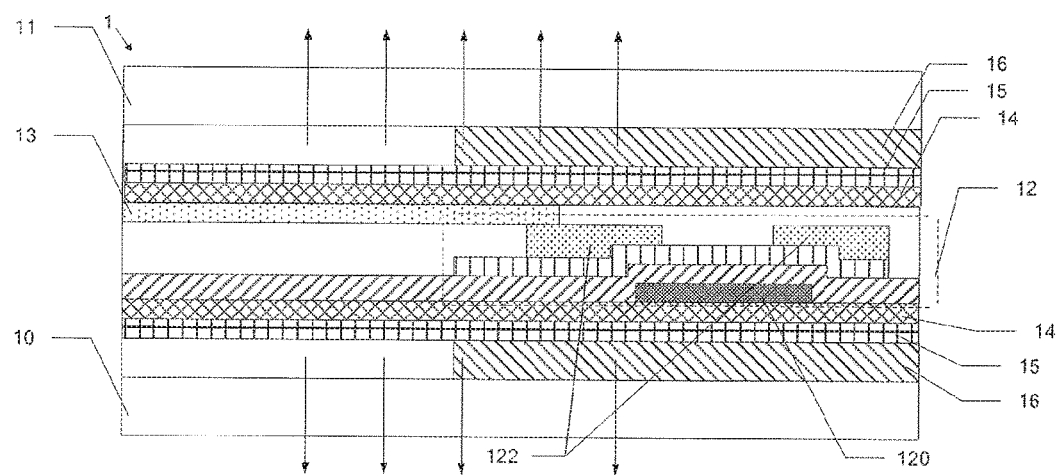
FIG. 6 is a diagram illustrating the structure of a display device in another embodiment.

FIGS. 4-6 are diagrams illustrating the structures of display devices in some embodiments. The embodiments shown in FIGS. 4-6 correspond to the embodiments as shown in FIGS. 1-3, respectively, with the difference that the half wave plates 15 and the quarter wave plates 14 in FIGS. 4-6 are not limited to the areas corresponding to the light absorbing layers 16. In FIGS. 1-3, the half wave plates 15 and the quarter wave plates 14 are disposed over the same areas covered by the light absorbing layers 16. In FIGS. 4-6, the half wave plates 15 and the quarter wave plates 14 additionally cover areas outside of those by the light absorbing layers 16. Optionally, the half wave plates 15 and the quarter wave plates 14 cover the entire display panel.

Optionally, in a dual-side emission display device, the widths of two light absorbing layers 16 are the same. Optionally, in a dual-side emission display device, the widths of two half wave plates 15 are the same, and/or the width of two quarter wave plates 14 are the same. Optionally, the widths of the half wave plates 15 and the quarter wave plates 14 substantially equal to the width of the display panel. The transistor can be a top gate transistor (i.e., the gate electrode is disposed on top of the source and drain) or a bottom gate transistor (i.e., the gate electrode is disposed underneath the source and drain).

Figure 7:
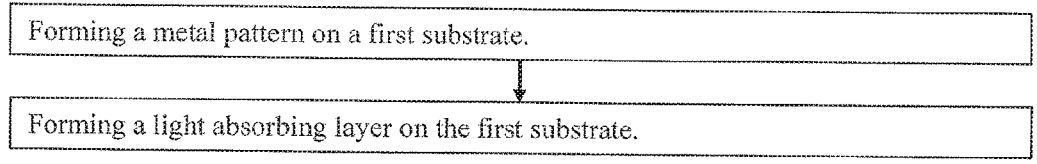
FIG. 7 is a diagram illustrating a method of manufacturing a display device in an embodiment.

FIG. 7 is a diagram illustrating a method of manufacturing a display device in an embodiment. Referring to FIG. 7, the method in the embodiment includes forming a metal pattern on a substrate and forming a light absorbing layer on the substrate. Optionally, the light absorbing layer has a pattern corresponding to at least a portion of the metal pattern. Optionally, the light absorbing layer can be patterned using a patterning process.

Optionally, the light absorbing layer (e.g., a liquid crystal polarizer) includes a mixture of liquid crystal polymer molecules and dichroic dye molecules. The mixture can be cured by, e.g., heat or ultraviolet light. Depending on the types of liquid crystal polymer molecules and dichroic dyes, various liquid crystal polymer to dichroic dye ratios may be used. Optionally, the weight ratio of the polymer liquid crystal molecules to the dichroic dye molecules in the mixture is in the range of 3:2 to 49:1, e.g., 3:2 to 13:7, 13:7 to 2:3, 2:3 to 3:1, 3:1 to 4:1, 4:1 to 17:3, 17:3 to 9:1, 9:1 to 19:1, 19:1 to 49:2. Optionally, the total weight percentage of the polymer liquid crystal molecules in the mixture is in the range of 60% to 98%, e.g., 60%-65%, 65%-70%, 70%-75%, 75%-80%, 80%-85%, 85%-90%, 90%-95%, 95%-98%. Optionally, the total weight percentage of the dichroic dye molecules in the mixture is in the range of 2% to 40%, e.g., 2%-5%, 5%-10%, 10%-15%, 15%-20%, 20%-25%, 25%-30%, 30%-35%, 35%-40%. In addition to the liquid crystal polymer molecules and the dichroic dye molecules, the mixture may contain additives, such as adhesion and/or toughness enhancers, rheology modifiers, plasticizers, surfactants, leveling agents, etc., depending, for example, on the desired optical properties of the display.

Figure 8:
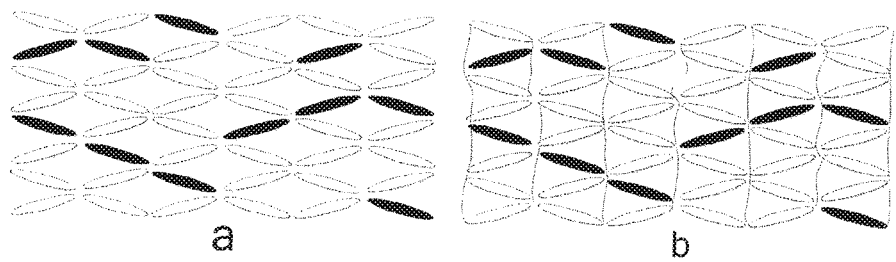
FIG. 8 is a diagram illustrating the formation of a light absorbing layer in an embodiment.

FIG. 8 is a diagram illustrating the formation of a light absorbing layer in an embodiment. Referring to FIG. 8, the light absorbing layer includes a mixture of liquid crystal polymer molecules white rods in FIG. 8) and dichroic dye molecules (black rods in FIG. 8). The structures of the mixture before and after the curing are shown in FIG. 8A and FIG. 8B, respectively. Specifically, the method of forming the light absorbing layer in the embodiment includes mixing liquid crystal polymer molecules and dichroic dye molecules, forming a liquid crystal polymer-dichroic dye mixture, curing the mixture by heating or irradiating the mixture with an ultraviolet light, forming a polymer network liquid crystal layer containing the dichroic dyes. The liquid crystal polymers may be polymerizable by an ultraviolet light or heat.

Figure 9:
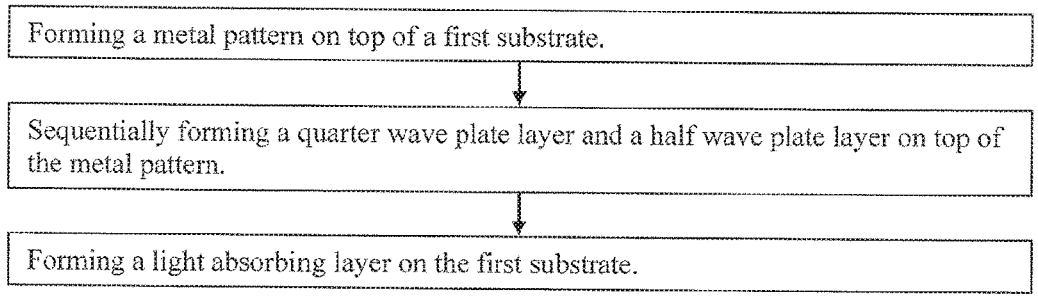
FIG. 9 is a diagram illustrating a method of manufacturing a display device in another embodiment.

FIG. 9 is a diagram illustrating a method of manufacturing a display device in an embodiment. The display device in the embodiment is a single-side emission display device, with the second substrate being the light emitting side (e.g., corresponding to a display device illustrated in FIG. 1 or FIG. 4). Referring to FIG. 9, the method in the embodiment includes forming a metal pattern on the first substrate (e.g., on the inner surface of the first substrate) and forming a light absorbing layer on the first substrate (e.g., on top of the metal pattern). The light absorbing layer has a pattern corresponding to at least a portion of the metal pattern. Optionally, the light absorbing layer can be formed using a patterning process. In the method illustrated in FIG. 9, the step of forming the light absorbing layer on the substrate is performed subsequent to the step of forming a metal pattern on the substrate so that the light absorbing layer is formed on top of the metal pattern. Subsequent to the step of forming the metal pattern and prior to the step of forming the light absorbing layer on the substrate, the method further includes sequentially forming a quarter wave plate layer and a half wave plate layer on top of the metal pattern. Optionally, the quarter wave plate layer and the half wave plate layer can be formed using a patterning process. The quarter wave plate layer and the half wave plate layer are so positioned that the light reflected by the metal pattern passes through the quarter wave plate layer and the half wave plate layer in a sequential order before it is absorbed by the light absorbing layer. Optionally, the half wave plate layer and the quarter wave plate layer cover at least the portion covered by the light absorbing layer. Optionally, the metal pattern in the embodiment includes a gate line metal pattern, a data line metal pattern, and/or a source/drain electrode metal pattern in a switching thin film transistor. Optionally, the metal pattern can also include other metal patterns such as a touch electrode metal pattern. Optionally, one or more of gate line, data line, source/drain electrode, touch electrode may be made of a transparent material.

Figure 10:
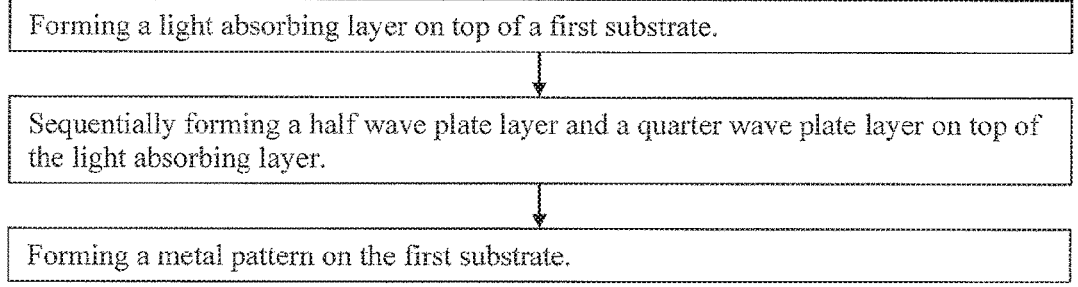
FIG. 10 is a diagram illustrating a method of manufacturing a display device in another embodiment.

FIG. 10 is a diagram illustrating a method of manufacturing a display device in another embodiment. The display device in the embodiment is a single-side emission display device, with the first substrate being the light emitting side (e.g., corresponding to a display device illustrated in FIG. 2 or FIG. 5). Referring to FIG. 10, the method in the embodiment includes forming a light absorbing layer on top of the first substrate (e.g., on the inner surface of the first substrate) and forming a metal pattern on the first substrate (e.g., on top of the light absorbing layer). Optionally, the light absorbing layer can be formed using a patterning process. The light absorbing layer has a pattern corresponding to at least a portion of the metal pattern. In the method illustrated in FIG. 10, the step of forming the light absorbing layer on the substrate is performed prior to the step of forming a metal pattern on the substrate so that the metal pattern is formed on top of the light absorbing layer. Subsequent to the step of forming the light absorbing layer and prior to the step of forming the metal pattern, the method further includes sequentially forming a half wave plate layer and a quarter wave plate layer on top of the light absorbing layer. Optionally, the half wave plate layer and the quarter wave plate layer can be formed using a patterning process. The half wave plate and the quarter wave plate are so positioned that light reflected by the metal pattern passes through the quarter wave plate layer and the half wave plate layer in a sequential order before it is absorbed by the light absorbing layer. Optionally, the half wave plate layer and the quarter wave plate layer cover at least the portion covered by the light absorbing layer. Optionally, the metal pattern in the embodiment includes a gate line metal pattern, a data line metal pattern, and/or a source/drain electrode metal pattern in a switching thin film transistor. Optionally, the metal pattern can also include other metal patterns such as a touch electrode metal pattern. Optionally, one or more of gate line, data line, source/drain electrode, touch electrode may be made of a transparent material.

Figure 11:
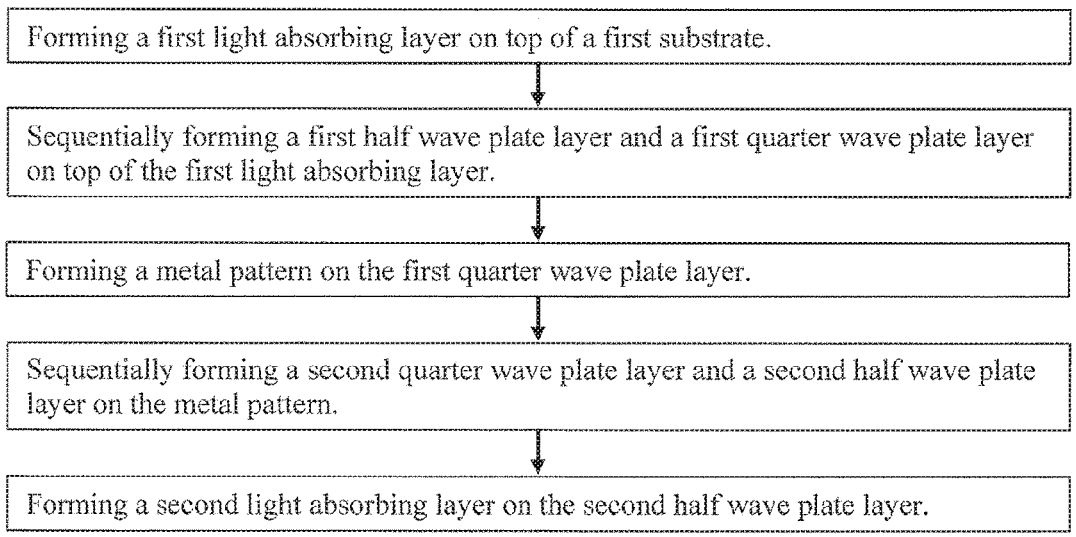
FIG. 11 is a diagram illustrating a method of manufacturing a display device in another embodiment.

FIG. 11 is a diagram illustrating a method of manufacturing a display device in another embodiment. The display device in the embodiment is a dual-side emission display device (e.g., corresponding to a display device illustrated in FIG. 3 or FIG. 6). Referring to FIG. 11, the method in the embodiment includes forming a first light absorbing layer on top of the first substrate (e.g., on the inner surface of the first substrate); sequentially forming a first half wave plate layer and a first quarter wave plate layer on top of the first light absorbing layer; forming a metal pattern on the first substrate (e.g., on top of the quarter wave plate layer); sequentially forming a second quarter wave plate layer and a second half wave plate layer on top of the metal pattern; and forming a second light absorbing layer on the first substrate (e.g., on top of the half wave plate layer). Optionally, the light absorbing layers, the half wave plate layers, and the quarter wave plate layers can be formed using a patterning process.

The first half wave plate layer and the first quarter wave plate layer are so positioned that light reflected by the metal pattern passes through the first quarter wave plate layer and the first half wave plate layer in a sequential order before it is absorbed by the first light absorbing layer. The second quarter wave plate layer and the second half wave plate layer are so positioned that the light reflected by the metal pattern passes through the second quarter wave plate layer and the second half wave plate layer in a sequential order before it is absorbed by the second light absorbing layer. Optionally, the half wave plate layers and the quarter wave plate layers cover at least the portion covered by the light absorbing layers. Optionally, the metal pattern in the embodiment includes a gate line metal pattern, a data line metal pattern, and a source/drain electrode metal pattern in a switching thin film transistor. Optionally, the metal pattern can also include other metal patterns such as a touch electrode metal pattern. Optionally, one or more of gate line, data line, source/drain electrode, touch electrode may be made of a transparent material.

As discussed above, the light absorbing layer may be made of any suitable light filtering material so long as it absorbs light reflected from the metal pattern. For example, the light absorbing layer can be a polarizer, e.g., a liquid crystal polarizer. The display device may be a liquid crystal display (LCD) device or an organic light-emitting display (OLED) device. An OLED device may include an organic light emitting diode. Optionally, the electrodes of the organic light emitting diode are made of a transparent electrode material such as indium tin oxide (ITO).

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:
1. A display device, comprising:
a first substrate;
a metal pattern on the first substrate, the first substrate including multiple surfaces with a first main surface, the first main surface being closest of the multiple surfaces to the metal pattern;
a transparent electrode;
a switching transistor for driving image display and comprising a drain electrode;
a first light absorbing layer positioned to absorb light reflected by the metal pattern;
a first quarter wave plate; and
a first half wave plate;
wherein the transparent electrode is electrically connected to the drain electrode of the switching transistor;
the first light absorbing layer has a pattern corresponding to at least a portion of the metal pattern, an orthographic projection of the first light absorbing layer in plan view of the first substrate on the first main surface is at least partially non-overlapping with an orthographic projection of the transparent electrode in plan view of the first substrate on the first main surface; and
the first quarter wave plate and the first half wave plate are so positioned that light reflected by the metal pattern passes through the first quarter wave plate and the first half wave plate in a sequential order before it is absorbed by the first light absorbing layer, wherein the first substrate is a substrate proximal to a first light emitting surface of the display device for image display.

2. The display device of claim 1, wherein the metal pattern, the first quarter wave plate, the first half wave plate, and the first light absorbing layer are sequentially arranged on the first substrate along a direction away from the first substrate.

3. The display device of claim 1, wherein the first light absorbing layer, the first half wave plate, the first quarter wave plate, and the metal pattern are sequentially arranged on the first substrate along a direction away from the first substrate.

4. The display device of claim 1, wherein the first light absorbing layer comprises a mixture comprising polymer liquid crystal molecules and dichroic dye molecules, a total weight percentage of the polymer liquid crystal molecules in the mixture is in a range of 60% to 98%, the total weight percentage of the dichroic dye molecules in the mixture is in a range of 2% to 40%, or a weight ratio of the polymer liquid crystal molecules to the dichroic dye molecules in the mixture is in a range of 3:2 to 49:1.

5. The display device of claim 2, wherein thickness of the first light absorbing layer is d, wherein $d=k\lambda/\sigma$, k is an integer, $\lambda$ is wavelength of an incident light reflected by the metal pattern, and $\sigma$ is refractive index of the first light absorbing layer.

6. The display device of claim 1, further comprising:
a second substrate facing the first substrate;
a second light absorbing layer positioned to absorb light reflected by the metal pattern;
a second quarter wave plate; and
a second half wave plate;
wherein the second light absorbing layer has a pattern corresponding to at least a portion of the metal pattern;
wherein the second quarter wave plate and the second half wave plate are so positioned that light reflected by the metal pattern passes through the second quarter wave plate and the second half wave plate in a sequential order before it is absorbed by the second light absorbing layer, wherein the second substrate is a substrate proximal to a second light emitting surface of the display device for image display.

7. The display device of claim 6, wherein the first light absorbing layer, the first half wave plate, the first quarter wave plate, the metal pattern, the second quarter wave plate, the second half wave plate, the second light absorbing layer, and the second substrate are sequentially arranged on the first substrate along a direction away from the first substrate.

8. The display device of claim 1, wherein the first light absorbing layer is a polarizer.

9. The display device of claim 1, wherein the display device is an organic electroluminescence display device comprising an organic light emitting diode, the organic light emitting diode is connected to the switching transistor and comprises the transparent electrode.

10. The display device of claim 1, wherein the metal pattern comprising one or a combination of a gate line metal pattern, a data line metal pattern, a source/drain electrode metal pattern, and a touch electrode metal pattern.

11. A method of manufacturing a display device, comprising:
forming a metal pattern on a first substrate, the first substrate including multiple surfaces with a first main surface, the first main surface being closest of the multiple surfaces to the metal pattern;
forming a switching transistor for driving image display and the switching transistor is formed to comprise a drain electrode;
forming a transparent electrode, the transparent electrode is formed to be electrically connected to the drain electrode of the switching transistor;
forming a light absorbing layer on the first substrate, wherein the light absorbing layer has a pattern corresponding to at least a portion of the metal pattern;
forming a quarter wave plate; and
forming a half wave plate;
wherein
the light absorbing layer is formed so that an orthographic projection of the light absorbing layer in plan view of the first substrate on the first main surface is at least partially non-overlapping with an orthographic projection of the transparent electrode in plan view of the first substrate on the first main surface; and
the quarter wave plate and the half wave plate are formed so that light reflected by the metal pattern passes through the quarter wave plate and the half wave plate in a sequential order before it is absorbed by the light absorbing layer, wherein the first substrate is a substrate proximal to a first light emitting surface of the display device for image display.

12. The method of claim 11, wherein forming the light absorbing layer on the first substrate is performed prior to forming a metal pattern on the first substrate so that the metal pattern is formed on top of the light absorbing layer.

13. The method of claim 11, wherein forming the light absorbing layer on the first substrate is performed subsequent to forming a metal pattern on the first substrate so that the light absorbing layer is formed on top of the metal pattern.

14. The method of claim 13, wherein the quarter wave plate and the half wave plate are formed subsequent to forming the metal pattern and prior to forming the light absorbing layer on the first substrate; and
the quarter wave plate and the half wave plate are sequentially formed on top of the metal pattern.

15. The method of claim 11, wherein the light absorbing layer comprises a mixture comprising polymer liquid crystal molecules and dichroic dye molecules, a total weight percentage of the polymer liquid crystal molecules in the mixture is in a range of 60% to 98%, the total weight percentage of the dichroic dye molecules in the mixture is in a range of 2% to 40%, or a weight ratio of the polymer liquid crystal molecules to the dichroic dye molecules in the mixture is in a range of 3:2 to 49:1.

16. The method of claim 15, wherein thickness of the light absorbing layer is d, wherein $d=k\lambda/\sigma$, k is an integer, $\lambda$ is a wavelength of the light reflected by the metal pattern and transmitted into the light absorbing layer, and $\sigma$ is a refractive index of the light absorbing layer.

17. The method of claim 11, wherein the display device is an organic electroluminescence display device, the method further comprising forming an organic light emitting diode on the first substrate comprising the metal pattern; and
wherein the organic light emitting diode is formed to be electrically connected to a switching transistor, and comprises a transparent electrode.

18. The display device of claim 1, wherein a boundary of the orthographic projection of the first light absorbing layer in plan view of the first substrate on the first main surface substantially overlaps with a boundary of an orthographic projection of the metal pattern in plan view of the first substrate on the first main surface.

19. The method of claim 12, wherein the half wave plate and the quarter wave plate are formed subsequent to forming the light absorbing layer, and prior to forming the metal pattern; and the half wave plate and the quarter wave plate are sequentially formed on top of the light absorbing layer.

20. The display device of claim 1, wherein each of the first light absorbing layer, the first quarter wave plate, and the first half wave plate is integrated in an array substrate of the display device.

* * * * *